United States Patent [19]

Collins et al.

[11] 4,035,666

[45] * July 12, 1977

[54] ANALOGUE SHIFT REGISTER CORRELATORS

[75] Inventors: Dean Robert Collins; Lewis T. Clairborne, both of Dallas, Tex.

[73] Assignee: Texas Instruments Incorporated, Dallas, Tex.

[ * ] Notice: The portion of the term of this patent subsequent to Mar. 23, 1993, has been disclaimed.

[21] Appl. No.: 620,673

[22] Filed: Oct. 8, 1975

Related U.S. Application Data

[62] Division of Ser. No. 196,043, Nov. 5, 1971, Pat. No. 3,946,247.

[51] Int. Cl.² .............. H03K 21/00; H03K 23/08; H03K 23/14; H03K 23/22
[52] U.S. Cl. .................. 307/221 D; 357/24; 357/41; 307/304; 333/70 T
[58] Field of Search .......... 357/24, 41; 307/221 D, 307/304; 333/70 T

[56] References Cited

U.S. PATENT DOCUMENTS 3,946,247   3/1976   Collins et al. .................. 357/24

OTHER PUBLICATIONS

Electronics, June 21, 1971, pp. 50–59, (Altman, Ed.).

Primary Examiner—Andrew J. James
Attorney, Agent, or Firm—Harold Levine; James T. Comfort; Rene' E. Grossman

[57] ABSTRACT

Semiconductor charge devices are defined to effect a serial-to-parallel conversion of analogue signal information. In one aspect of the invention, a digital signal is extracted from an analogue noise environment by a shift register correlator comprising a bucket-bridge configuration of field-effect transistors in combination with gating field-effect transistors which are effective to weight the amplitude of the data in corresponding bits of the shift register. The gates of the gating transistors are selectively connected to diffused regions of transistors of the bucket-brigade delay line to effect parallel tapped outputs therefrom. The weighted signals from the gating transistors are summed at a common terminal to form the auto-correlated output. In a different aspect of the invention, the analogue delay line is effected by a charge-coupled shift register, parallel taps being obtained from diffused regions under selected electrodes of the shift register ohmically connected to gates of the gating field-effect transistors.

3 Claims, 9 Drawing Figures

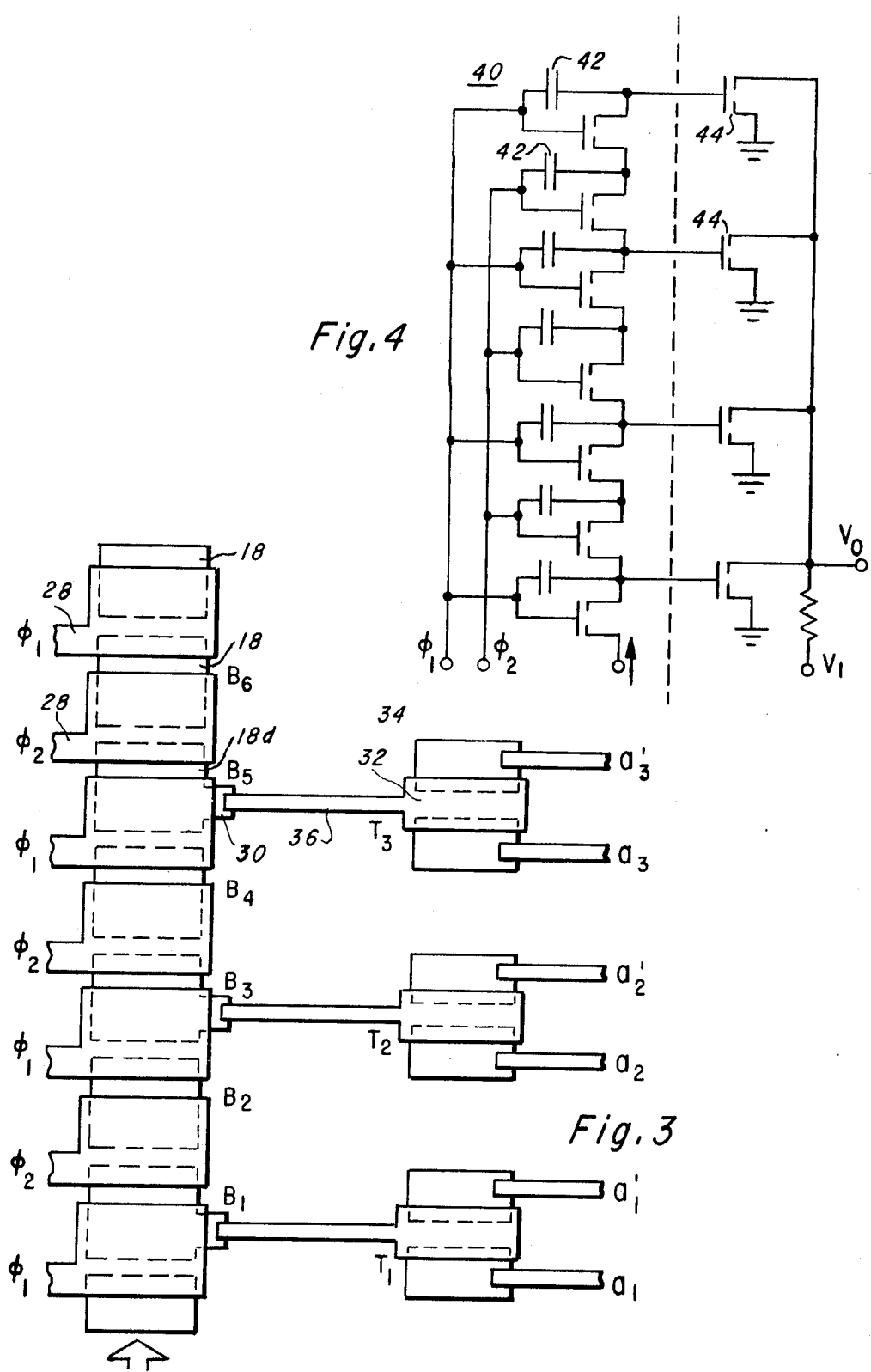

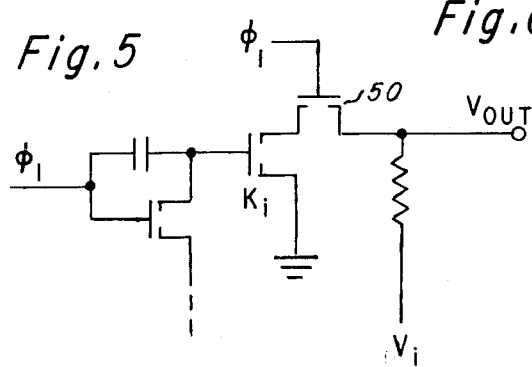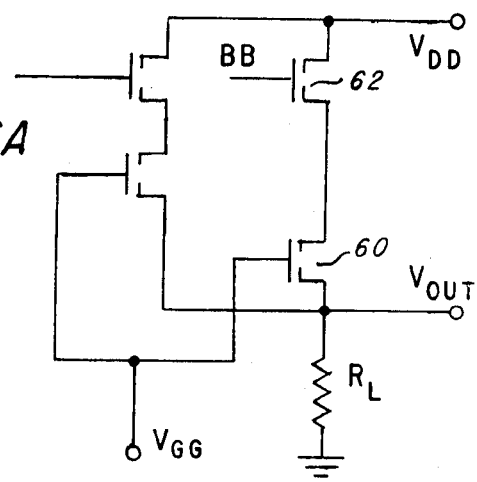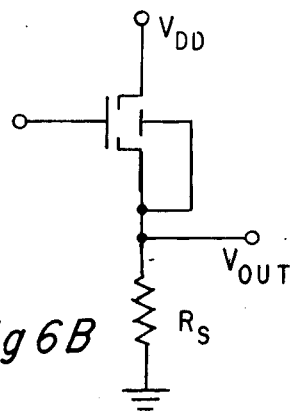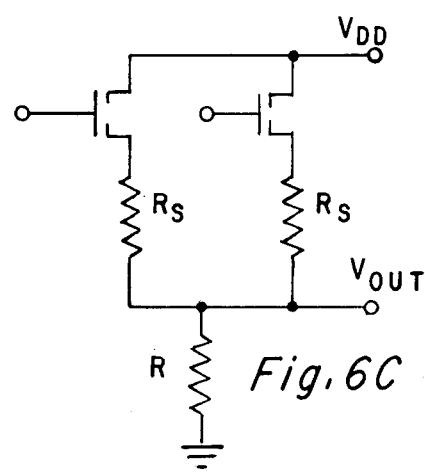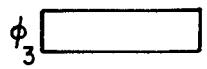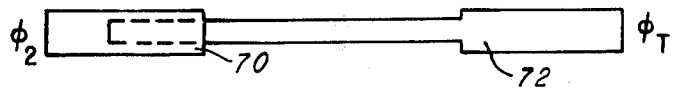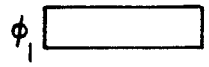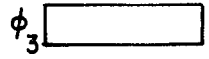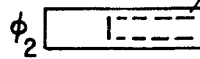

ANALOGUE SHIFT REGISTER CORRELATORS

This is a division of application Ser. No. 196,043, filed Nov. 5, 1971 now U.S. Pat. No. 3,946,247

The present invention pertains to semiconductor charge devices in general, and more particularly, to analogue shift register correlators.

In the processing of electrical signals, it is often required to extract a signal from a noise background. This is often effected using auto-correlation or cross-correlation techniques. Such auto-correlation is typically effected using devices generally referred to as matched filters, transversal filters, chirp filters, etc. Basically, what is done is to form a weighted sum of a number of inputs such that:

$$V_{out}(t) = \sum_{i=1}^{n} K_i(t)v_i(t)$$

Where the $K_i$'s are the weighting values (which may be a function of time) $v_i$'s are the input or sample variables which a function of time and $V_{out}(t)$ is the weighted sum, and $n$ is the number of bits in the correlator. In practice the $K_i$'s may be time independent and in fact may be rather simple constants such a 0 or 1, or $-1$ and $+1$. While the $v_i$'s could also possess only digital values such as 0 or 1, it is more common for the $V_i$'s to be analogue functions. This is true even though the signal may be digital since the noise is in general analogue.

Basically in order to effect auto-correlation, a serial-to-parallel conversion of analogue signals is required. Processing of analogue signals generally has pertained to delay functions, such as by passing the signals through an electrical transmission line, such as a coaxial cable or a LC network where the distributed inductance and capacitance of a cable are lumped in a number of coils and capacitors. Such transmission lines, however, are generally effective for delays of only a few microseconds at the most, and longer delays are required for many applications. Acoustic surface wave devices have also been utilized to form delay lines, but they also provide only a relatively short delay since generally such surface wave devices require a clocking rate greater than about 20 MHs.

One technique that has been proposed for providing longer delays is to make a shift register for analogue signals wherein sampled values of the analogue signals are stored in the form of charges on a series of capacitors. Between each of the storage capacitors there is located a switch that transfers the charge from one capacitor to the next on a command from a clock pulse. Since each storage capacitor cannot pick up its new charge until it has passed on the old one, only half of the capacitors carry information, and the ones in between are empty. Such a delay line has typically been referred to as a "bucket-brigade delay line." Such a delay line, or analogue shift register, may be constructed utilizing insulated gate field-effect transistors (IGFETS). Details of such an analogue shift register are described in Sangster's, "The Bucket Brigade Delay Line, a Shift Register for Analogue Signals," PHILIPS TECHNICAL REVIEW, Vol. 31, 1970, No. 4.

Thus, a field-effect transistor bucket-brigade delay line can be utilized as an analogue shift register. To effect auto-correlation, it is necessary to provide serial to parallel conversion and weighting of the signals. The above referenced Sangster's article describes one technique of weighting signals where the electrodes forming the capacitors are geometerically arranged in a preselected ratio. A major problem associated with this technique, however, pertains to the difficulty in measuring the signal current, since generally only on the order of picoamps are flowing in the semiconductor substrate while on the order of amperes of current are flowing in the clock lines. It is difficult to detect the small amount of current change representing the signal. Also, the configuration of geometerically arranging the capacitors requires relatively large size for the devices.

Accordingly, an object of the present invention is to provide an improved serial to parallel converter for analogue signals.

A further object of the present invention is to provide an analogue shift register auto-correlator.

Another object of the invention is to provide a field-effect transistor configured bucket-brigade analogue shift-register correlator.

Yet another object of the invention is to provide an auto-correlator wherein a field-effect transistor provides the weighting function.

Briefly in accordance with the present invention, an analogue shift register correlator comprises a plurality of shift register bits defined on one surface of a semiconductor substrate. Means are included for applying clock signals to serially shift the data in a predetermined direction. Weighting means are connected to respective bits of the shift register to weight the data at that bit with a preassigned weighting value. The weighted values of the respective bits are summed together to provide an auto-correlated output signal.

In one aspect of the invention, the shift register is defined by a field-effect transistor configured bucket-brigade delay line. In a different aspect of the invention, the shift register is defined by a plurality of semiconductor charge-coupled devices.

In the preferred embodiment of the invention, the weighting means comprises an insulated gate field-effect transistor, the gate electrode of which is electrically connected to a corresponding bit of the analogue shift register. In this configuration, the gain of the transistor defines the weighting coefficient. In a different embodiment of the invention, the weighting function is effected by two series connected field-effect transistors where the weighting coefficient is defined by the Beta ratio between the two transistors.

Additional novel features, advantages, and objects of the present invention will be apparent upon reading the following detailed description of illustrative embodiments of the present invention in conjunction with the drawings wherein:

FIG. 3 is a schematic of a bucket-brigade delay line and associated high impedence field-effect transistor output taps;

FIG. 4 schematically illustrates a portion of an analogue matched filter system in accordance with the present invention;

FIG. 5 schematically illustrates a gated output configuration of the present invention;

FIGS. 6a–6c schematically depict various output circuits that may be utilized with the present invention; and FIG. 7 illustrates a charge-coupled device embodiment for the analogue shift register.

Figure 1:
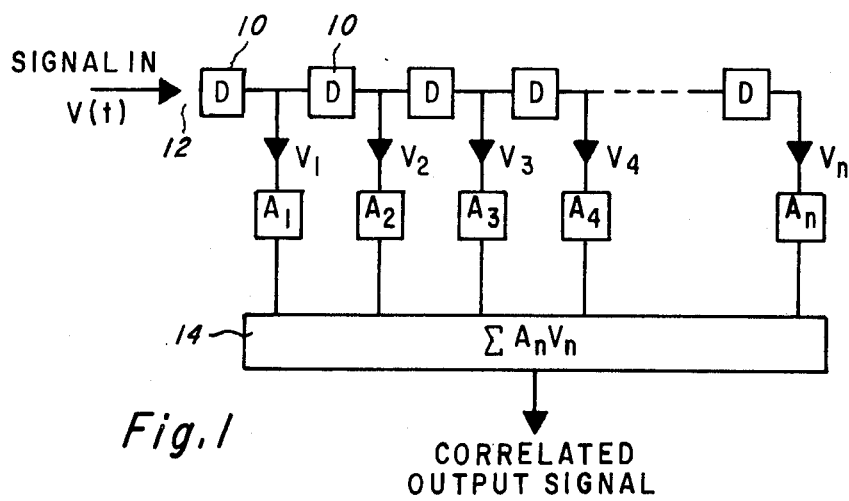
FIG. 1 is a functional block diagram illustrating an autocorrelator in accordance with one embodiment of the present invention.

With reference now to the drawings, FIG. 1 illustrates in functional block diagram format the elements required to perform the matched filter or auto-correlation function of the present invention. Discrete bits of an analogue delay line are illustrated, generally, at 10. By way of example, these bits may be defined by a field-effect transistor bucket-brigade configured analogue shift register or a semiconductor charge-coupled device analogue shift register. Information in the form of electrical charge is inputed to the delay line at 12. This information is illustrated as being a voltage as a function of time. The signals $V_1$, $V_2$, $V_3$ ... $V_n$ represent parallel tapped outputs from the analogue delay line. Blocks $A_1$, $A_2$, $A_3$ ... $A_n$ represent weighting coefficients, and block 14 labeled $\Sigma A_n V_n$ is the desired auto-correlated output. As may be seen, input signals are fed serially into the delay bits labeled D in block 10; and tapped parallel outputs are weighted by weighting functions $A_1 - A_n$ to form the correlated output signal.

Figure 2:
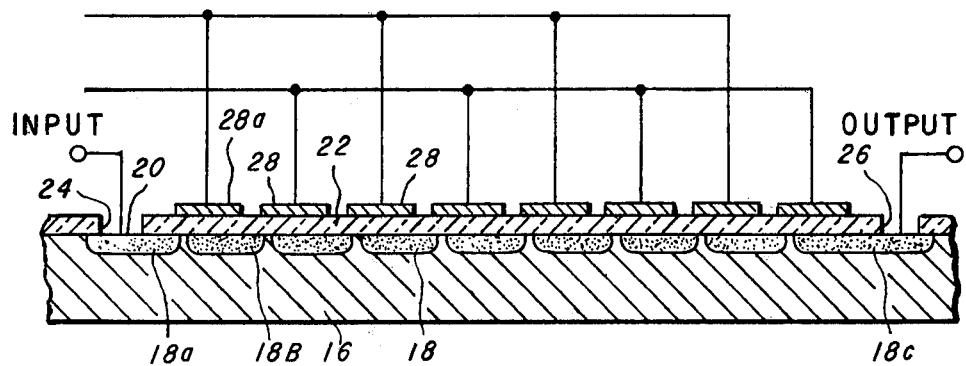
FIG. 2 is a cross-sectional view of a bucket-brigade shift register that may be used in accordance with the invention.

With reference to FIG. 2, there is illustrated in cross-sectional view a bucket-brigade analogue shift register of field-effect devices. With reference to FIG. 2 a substrate or semiconductor material is illustrated at 16. The substrate may be of any suitable semiconductor materials such as silicon, germinium, gallium arsenide, etc. For illustration, N-type silicon is utilized. Pockets of P-type material are illustrated at 18. These pockets may be formed by conventional diffusion techniques, ion implantation or expitaxial techniques. Such techniques are well known to those skilled in the art and will not be described in detail herein.

The P-type regions 18 extend to the upper surface 20 of the substrate 16. A relatively thin insulating layer 22 is formed to overlie the surface 20 of the substrate 16. The insulating layer 22 may, by way of example, comprise an oxide such as silicon oxide or a nitride or a combination of the two. Generally the layer 22 is formed to a thickness of between 500 to 1500 A. Apertures 24 and 26 are opened through the insulating layer 22 at opposite ends of the shift register to expose portions of the diffused regions 18a and 18c respectively. Input data is entered by ohmic contact to the diffusion region 18a and the output of the shift register is taken from an ohmic contact to the diffused region 18c. A plurality of elongated, generally parallel electrodes 28 are formed over the insulating layer. Each electrode such as 28a overlies at least the region between adjacent, diffused regions such as, by way of example, 18a and 18b, and extends laterally over a region of the diffused pocket to enhance the miller capacitance and enables more effective storage of charge. Adjacent electrodes are connected to different clock sources referenced as $\phi_1$, and $\phi_2$.

In operation of the shift illustrated in FIG. 2, charge is normally inserted at one end of the shift register through a P-N junction such as 18a, transferred down the chain of field-effect transistors and detected at another P-N junction such as 18c. It will be noted that except for the ohmic contact to the output P-N junction, there is nothing to distinguish this junction from any other junction in the chain of diffused regions 18. In fact, it is possible to sense charge through ohmic contacts simultaneously at different positions along the delay line. In order not to affect the charge going down the delay line, the sensing, however, must be done with a high impedance tap.

With reference to FIG. 3, there is illustrated in plan view a bucket-brigade register with associated high impedance field-effect transistor output taps. Again the diffused regions are illustrated generally at 18. The electrodes by which the clock pulses $\phi_1$ and $\phi_2$ are applied are illustrated at 28. An ohmic contact to the diffused 18d of bucket 5 ($B_5$) of the bucket-brigade shift register is illustrated at 30. The ohmic contact extends to the gate electrode 32 of an insulated gate field-effect transistor which is utilized to tap, that is, detect information or charge present in the diffused region 18d. For example, if electrical charge is stored in this region, the gate 32 is charged to a relatively high value enabling transistor 34 to go into a conductive state and provide a signal through leads $A_3 40$ and $A_3$.

In operation of the circuit illustrated in FIG. 3, analogue information is inserted at one end of the bucket-brigade shift register, such as bucket 1 ($B_1$) and shifted along the register. Thus, the amount of charge (analogue) in the buckets represent the term $v_1(t)$. The function of time is involved since the charge in a particular bucket is itself a function of time. Once the charge is in a particular bucket, part of the charge is also transferred to the gate of the associated insulated gate field-effect transistor, such as transistor 34 associated with bucket 5. An ohmic to the diffused region of the bucket bit is connected to the gate of the insulated gate field-effect transistor by a metal lead 36, and the amount of charge that is transferred to the gate depends on the ratio of gate capacitance of the transistor 34 to the bucket capacitance.

With reference to FIG. 4, there is schematically illustrated a portion of an analogue matched filter system in accordance with the present invention, illustrating application of weighting functions to the $v_i(t)$ signals to produce the output sum $V_{out}(t)$. A bucket-brigade shift register is generally illustrated at 40. The enhanced miller capacitance of each transistor is shown schematically at 42. The taps to the bucket bits are connected to the gate electrode of a corresponding insulated gate field-effect transistor 44. In this configuration, the $k_i$ values, that is, weighting coefficients, are simply the gain of the insulated field-effect transistors 44. If the transistors 44 are either just turned on or off by the values of the $_i$'S transferred to the gates thereof, then the weighting function $k_i$ is either 0 or 1. However, if the insulated gate field-effect transistors are biased in the linear regions, then the weighting function can be determined by the Z/L ratio of the individual transistors.

In general, since the buckets carry information only in every other bucket (every third electrode for the case of the charge-coupled device) some type of gating or sample and hold circuit is necessary in order not to look at the full buckets. However, in certain applications it may be desirable to sample every bucket (or every electrode for the charge-coupled device). A suitable gating arrangement is illustrated in FIG. 5 by the transfer gates shown generally at 50. In this configuration, an insulated gate field-effect transistor is placed on series with the output transistor, i.e., the weighting transistor, and the output. The gating transistor 50 may utilize the same clock pulse $\phi_1$ driving the bucket stage if desired.

In FIG. 4 the weighting function is illustrated as utilizing a source follower insulated gate field-effect transistor. A number of different field-effect transistor circuits could be utilized to obtain the weighting coefficient, such as for example, standard IGFET inverters with the load either saturated or unsaturated; source follower circuits using standard IGFET loads with substrates grounded and source follower circuits using a current-source load device. Reference for example, Lawrence's, "Linear Metal Oxide Semiconductor Integrated Circuits," SOLID STATE TECHNOLOGY, May, 1969, P. 31. Also two stages of linear amplication with a gain of unity coud be used in the weighting outputs of signal processors. Reference Mao, et al. IEE JOURNAL OF SOLID STATE CIRCUITS, Vol. SC-4 No. 4, P.196, August, 1969.

Various configurations may be utilized to sum the output from the tapped bits. For example, with reference to FIG. 6a, two series connected insulated field-effect transistors 60 and 62 are utilized to provide the output tap. The gate of transistor 60 is connected to a power supply $V'_{GG}$. A single summing resistor $R_L$ is required. The transistor 60 is biased via $V'_{GG}$ to act as a resistor. Preferably the resistance of transistor 60 is large compared to the value of $R_L$. An advantage of this circuit arrangement is that only one ouput connection from the chip is required. Preferably the load transistor 60 operates in the triode region while the tap 62 operates in the saturation region.

With reference to FIG. 6b, a source-follower configuration is illustrated with an external fixed resistor $R_s$. In this configuration the load field-effect transistor illustrated in FIG. 6a, i.e., transistor 60, is not utilized.

With reference to FIG. 6c, an output circuit is illustrated wherein the sum of the currents is generated. For this situation, the value of the resistance $R_s$ should be much larger than the value of the resistance $R_L$ so that the different stages of bits or the bucket-brigade will be effectively decoupled.

With reference to FIG. 7, there is illustrated an embodiment of the present invention where charge-coupled devices are utilized for the ananlogue shift register. In FIG. 7 it is assumed that the charge-coupled device (CCD) $\phi_2$ electrodes are biased to receive the input information, i.e., define a "potential well" thereunder. The information is transferred from a diffused region 70 underlying the $\phi_2$ electrode by the transfer gate 72 by applying a suitable pulse thereto. By way of example, the transfer gate 72 may be the gate electrode of a field-effect transistor 34, illustrated in FIG. 3. The diffused region 70 may be formed to extend beyond the boundary of the $\phi_2$ electrode, if desired.

While various embodiments of the present invention have been described in detail, it will be apparent to a person skilled in the art that various modifications may be made without departing from the scope or spirit of the present invention.

What is claimed is:

1. A charge transfer device correlator comprising:
   a. a semiconductor substrate;
   b. a charge transfer device shift register having a plurality of successive stages defined adjacent one surface of said substrate, each said stage including a plurality of electrodes disposed on an insulating layer on said substrate surface;
   c. means for applying clocking pulses to said electrodes for entering data samples into and propagating said data samples along said shift register; and
   d. data sampling and amplitude weighting means for simultaneously detecting the data samples stored at each of said plurality of stages to produce a detected signal and for amplitude weighting said detected signals in a pre-selected manner, said data sampling and amplitude weighting means including a plurality of insulated gate field effect transistor respectively disposed adjacent said substrate surface adjacent a corresponding stage of said shift register, the gate electrodes of said plurality of transistors respectively connected to the corresponding stage of said shift register for detecting said data sample stored at that stage, each of said plurality of transistors defining a predetermined gain for weighting the amplitude of the detected signal produced by that transistor, source electrodes of each of said plurality of transistors commonly connected to the circuit ground; signal summation means; and insulated gate field effect transistor gating means connecting the drain electrodes of said first plurality of transistors to said signal summation means for transferring detected and weighted signals to said summation means in reponse to gating signals received by said transistor gating means.

2. A correlator according to claim 1, wherein said shift register is a charge coupled device shift register.

3. A correlator according to claim 2, further including a doped region in said substrate beneath an electrode of each stage of said shift register, and wherein the gates of said plurality of transistors are connected respectively to said doped regions for detecting the data samples stored at said stages.

* * * * *